(12) United States Patent
Park

(10) Patent No.: US 6,716,658 B2
(45) Date of Patent: Apr. 6, 2004

(54) METHOD OF PREVENTING GENERATION OF PARTICLES IN CHAMBER

(75) Inventor: Keun No Park, Kyoungsangbuk-do (KR)

(73) Assignee: LG. Philips LDC Co., Ltd., Seoul (KR)

( * ) Notice: Subject to any disclaimer, the term of this patent is extended or adjusted under 35 U.S.C. 154(b) by 0 days.

(21) Appl. No.: 09/725,572

(22) Filed: Nov. 30, 2000

(65) Prior Publication Data

US 2001/0002338 A1 May 31, 2001

(30) Foreign Application Priority Data

Nov. 30, 1999 (KR) ........................................ 1999-53732

(51) Int. Cl.$^7$ ............................................. H01L 21/00
(52) U.S. Cl. ......................... 438/30; 438/758; 438/905; 438/158
(58) Field of Search ........................... 438/30, 158, 905

(56) References Cited

U.S. PATENT DOCUMENTS

| 4,592,926 A | * | 6/1986 | Rubin et al. ................ 118/500 |
| 5,015,330 A | * | 5/1991 | Okumura et al. ........... 156/643 |
| 5,280,012 A | * | 1/1994 | Kirlin et al. ................ 505/447 |
| 5,501,870 A | * | 3/1996 | Shiraishi et al. ............... 427/8 |
| 5,728,602 A | * | 3/1998 | Bellows et al. ............. 437/225 |
| 6,043,162 A | * | 3/2000 | Shimizu et al. ............. 438/706 |
| 6,060,397 A | * | 5/2000 | Seamons et al. ............ 438/694 |
| 6,091,056 A | * | 7/2000 | Kannan et al. ............. 219/390 |
| 6,214,751 B1 | * | 4/2001 | Lee ............................. 438/800 |
| 6,362,115 B1 | * | 3/2002 | Mandal ....................... 438/780 |

OTHER PUBLICATIONS

Academic Press Dictionary of Science and Technology, http://www.harcourt.com/dictionary/def/8/2/9/0/8290900.html, Purge definition.*

* cited by examiner

Primary Examiner—John Niebling
Assistant Examiner—Angel Roman
(74) Attorney, Agent, or Firm—Birch, Stewart, Kolasch & Birch, LLP

(57) ABSTRACT

A method of preventing contaminating particles in a chamber in a deposition device is presented. In the method, a substrate is mounted within a chamber of gas-exposure equipment. The pressure within the chamber is reduced and a treatment gas is injected into the chamber to convert a surface of the substrate to be organic. After a desired time is elapsed, the pressure within the chamber is allowed increase to atmospheric pressure or above by introducing nitrogen gas into the chamber. Nitrogen gas introduction prevents entry of air, including the moisture within the air. Without the moisture, contaminating particles are not generated since the moisture is prevented from reacting with an ammonia component of the treatment gas.

12 Claims, 3 Drawing Sheets

METHOD OF PREVENTING GENERATION OF PARTICLES IN CHAMBER

FIELD OF THE INVENTION

This invention relates to a method of fabricating a liquid crystal display, and more particularly to a method of preventing a generation of contaminating particles in a chamber within a deposition device.

BACKGROUND OF THE INVENTION

Liquid crystal displays (LCD) have advantages such as small size, thinness, and low power consumption. Thus, LCDs have been used in notebook computers, office automation equipment, audio/video equipment, etc. In particular, active matrix LCDs, using thin film transistors (TFT) as switching devices, are suitable for displaying dynamic images.

The active matrix LCD displays a picture corresponding to a video signal, such as a television signal, on a picture element or pixel matrix having pixels arranged at intersections between gate lines and data lines. Each pixel includes a liquid crystal cell controlling an amount of light transmitted in accordance with a voltage level of a data signal from the data line. The TFT is installed at each intersection between the gate and data lines to switch data signals transmitted to the liquid crystal cell in response to scanning signals from the gate line.

FIG. 1 shows a TFT formed on a substrate 1. A method of fabricating a conventional TFT is described below. First, a metal such as Al, Mo, Cr or their alloy, etc., is deposited and patterned by photolithography to form a gate electrode 20 and a gate line (not shown).

Then a gate insulating film 22, made from an organic material such as $SiN_x$ or $SiO_x$, is deposited on the substrate 1 and over the gate electrode 20. A semiconductor layer 24, made from an amorphous silicon (a-Si) layer, and an ohmic contact layer 26, made from an a-Si doped with n+ ions, are subsequently deposited on the gate insulating film 22.

Afterwards, a source electrode 28 and a drain electrode 30, both made from a metal such as Mo or Cr, are formed on the ohmic contact layer 26. The source electrode 28 is patterned integrally with the data line. Also a portion of the ohmic contact layer 26 exposed through an opening between the source electrode 28 the drain electrode 30 is removed by dry or wet etching.

A protective film 32, made from $SiN_x$ or $SiO_x$, is deposited to cover the TFT including over the source electrode 28 and the drain electrode 30. Subsequently, a contact hole is formed on the protective film 32 to expose a portion of the drain electrode. Then a pixel electrode 34, made from an indium tin oxide (ITO) is coated and is connected, via the contact hole, to the drain electrode 30.

When fabricating the TFT, the gate electrode 20, the gate line (not shown), the source electrode 28, the data line (not shown), the drain electrode 30, the pixel electrode 34, as well as a color filter and a black matrix (both not shown) are formed and patterned using photoresists as masks in a light-exposure and development environment using a photo equipment.

It is difficult to bond the photoresist, which is made of an organic material, to the substrate which is made of almost entirely inorganic material. Thus, to improve the adhesive force between the photoresist and the substrate 1, the surface of the substrate 1 is converted into an organic material using hexa methyl disiliane (HMDS) prior to formation of the photoresist. This process is described in conjunction with FIG. 2.

First, as shown in FIG. 2, a substrate 1 is mounted into an adhesion chamber 2 of the photo equipment. Thereafter, a door of the adhesion chamber 2 (not shown) is closed to keep the interior of the chamber 2 airtight. Then, ejection valves 16a and 16b are opened and gases within the adhesion chamber 2 are evacuated through ejection lines 14a and 14b to decrease pressure within the adhesion chamber 2.

Next, nitrogen $N_2$ is injected into an HMDS tank 4 to generate HMDS gas and supply valves 6a and 6b are opened to supply HMDS through supply lines 8a and 8b. The HMDS gas is injected into the adhesion chamber 2 in a bubble shape by a pressure difference between the interior of the HMDS tank 4 and the interior of the adhesion chamber 2. Evacuation lines 10a and 10b are opened to continuously draw the HMDS gas into the adhesion chamber 2 by opening evacuation valves 12a and 12b.

After a desired amount of time has elapsed, the supply valves 6a and 6b are closed. However, the evacuation valves 12a and 12b remain open to continuously draw the HMDS gas through the evacuation lines 10a and 10b.

Then the pressure within the adhesion chamber 2 is equalized to atmospheric pressure by allowing air to enter the chamber. Finally, the door of the adhesion chamber 2 is opened and the substrate 1 is taken out.

However, the gas-exposure equipment as shown in FIG. 2 has a problem in that moisture in the air also enters the adhesion chamber 2 when the air is allowed to enter. The moisture, within the adhesion chamber 2, generates a white compound by combining with an ammonia component of the HMDS. This white compound converts into particles and contaminates the interior of the adhesion chamber 2 and the substrate 1. The contamination particles on the substrate 1 leave a film residue upon patterning of the photoresist film and causes a short between the electrodes. The contamination also causes visible stains when displaying images.

SUMMARY OF THE INVENTION

Accordingly, it is an object of the present invention to provide a method of preventing generation of particles in a chamber that is adapted to reduce the generation of particles.

In order to achieve these and other objects of the invention, a method of preventing generation of particles in a chamber according to the present invention includes the steps of mounting a substrate within a chamber of a photo equipment; decreasing a pressure within the chamber; injecting a surface treatment gas into the chamber; and evacuating the chamber while injecting a nitrogen gas into the chamber.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
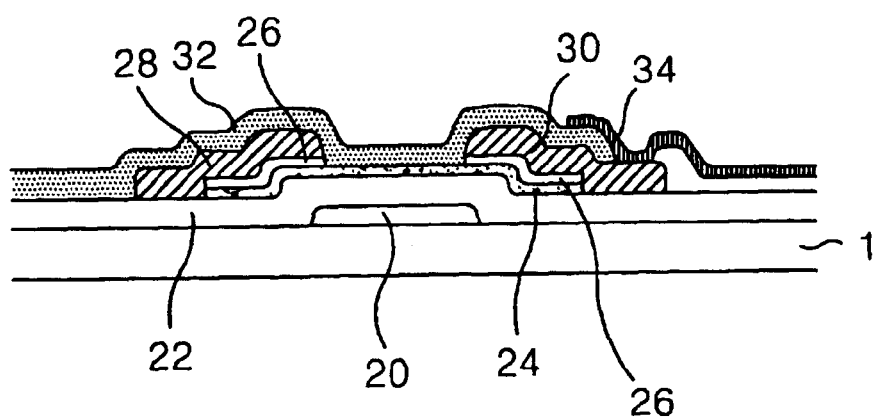
FIG. 1 is a section view showing a structure of a conventional thin film transistor.
Figure 2:
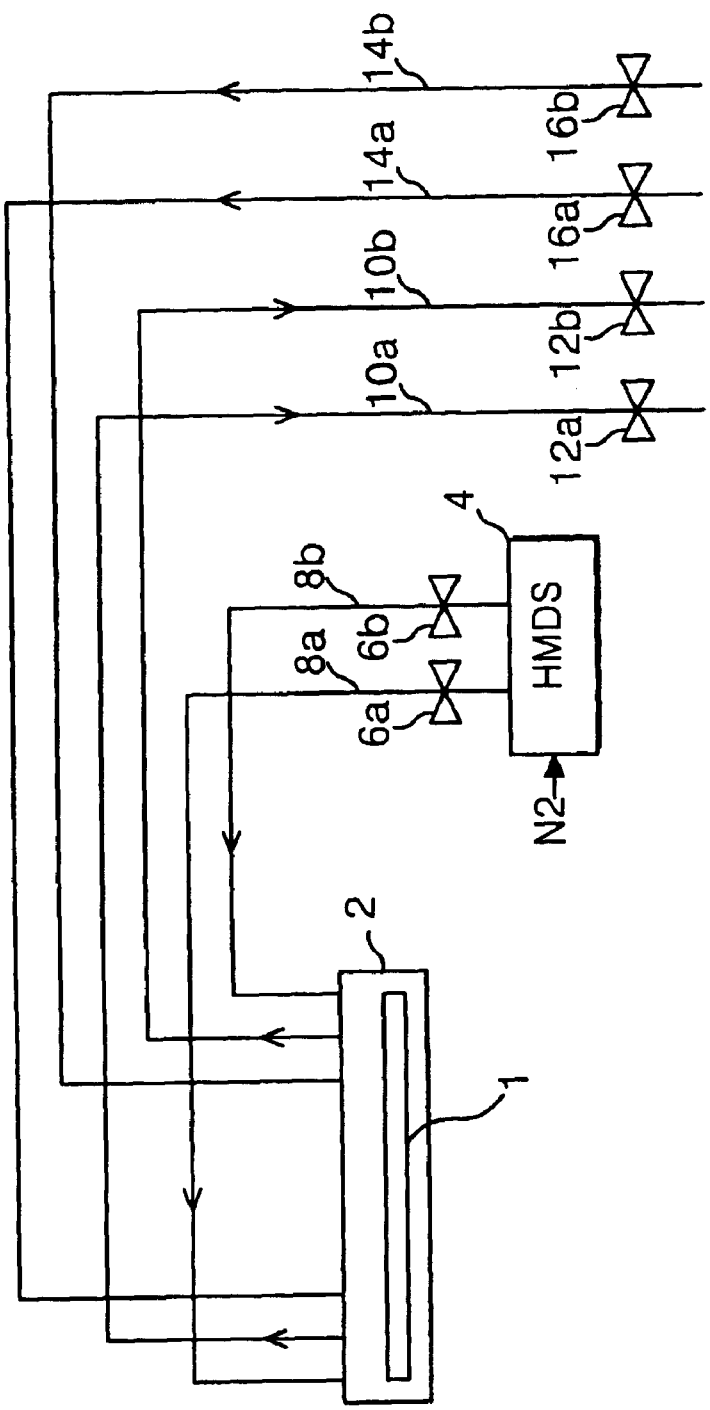
FIG. 2 is a schematic view showing a configuration of a conventional photo equipment.
Figure 3:
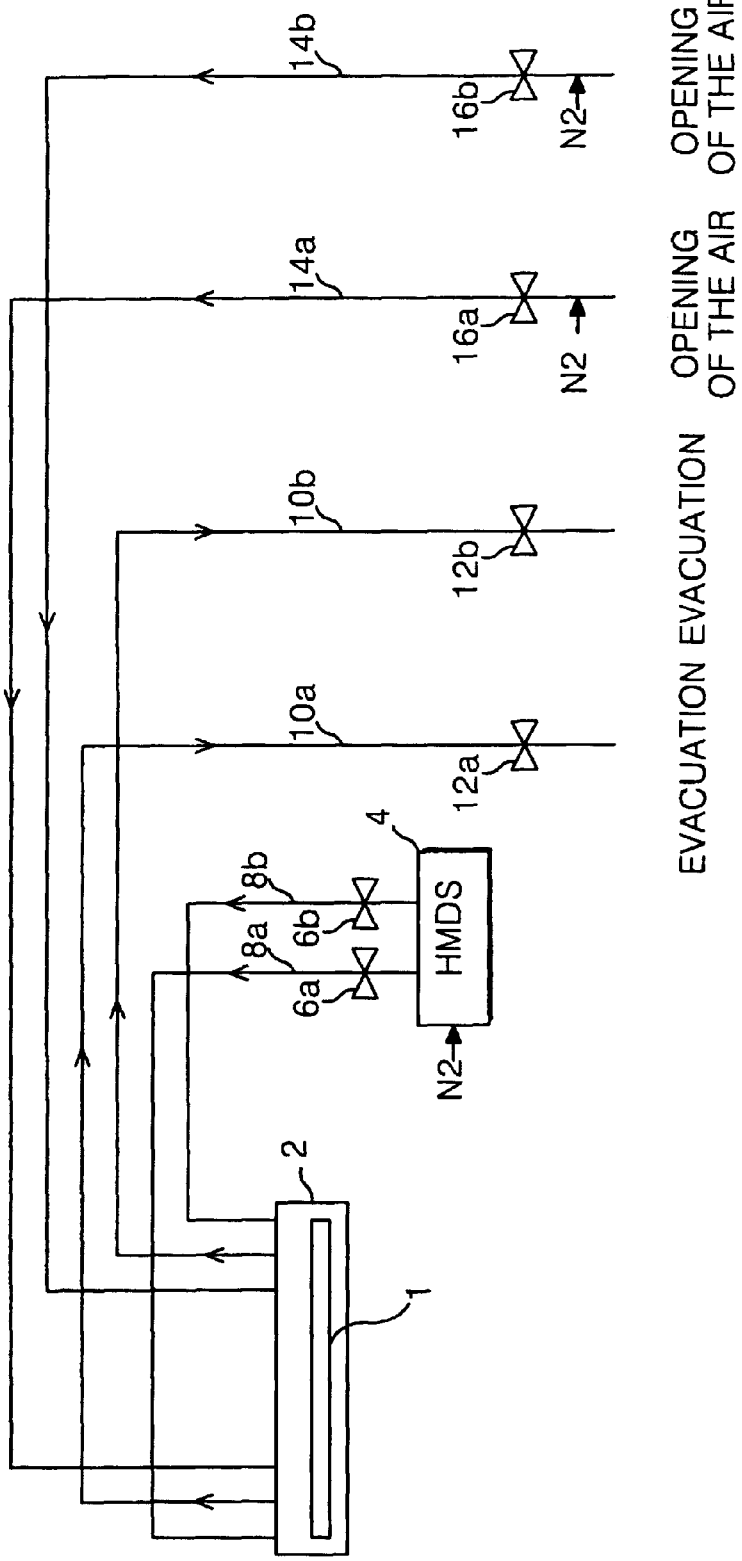
FIG. 3 is a schematic view of photo equipment for explaining a method of preventing generation of particles in a chamber according to an embodiment of the present invention.

Referring to FIG. 3, in a method of preventing generation of particles in a chamber according to an embodiment of the present invention, nitrogen N$_2$ is injected at the time the pressure within the adhesion chamber is equalized to atmospheric pressure to minimize the amount of moisture entering into the adhesion chamber.

In this method, a substrate 1 is first mounted within an adhesion chamber 2 to begin the substrate surface treatment using the HMDS gas. After the substrate 1 is mounted, the interior of the adhesion chamber 2 is kept airtight. Then, ejection valves 16a and 16b are opened and gases within the adhesion chamber 2 are evacuated through ejection lines 14a and 14b. Thus, the pressure within the adhesion chamber 2 is reduced to a desired vacuum pressure.

Next, nitrogen N$_2$ is injected into a HMDS tank 4 to generate a HMDS gas. When a desired amount of HMDS gas is generated, supply valves 6a and 6b are opened to supply HMDS through supply lines 8a and 8b. The HMDS gas is injected into the adhesion chamber 2 in a bubble shape by a pressure difference between the interior of the HMDS tank 4 and the interior of the adhesion chamber 2. Evacuation lines 10a and 10b are opened to continuously draw the HMDS gas into the adhesion chamber 2 by opening evacuation valves 12a and 12b.

After a desired amount of time has lapsed, the supply valves 6a and 6b are closed. However, the evacuation valves 12a and 12b remain open to continuously draw the HMDS gas through the evacuation lines 10a and 10b.

The ejection valves 16a and 16b are opened so that the pressure within the adhesion chamber 2 may be equalized with atmospheric pressure. At the same time, nitrogen is injected into the ejection lines 14a and 14b while the gas within the adhesion chamber 2 is evacuated through the evacuation lines 10a and 10b.

In this manner, while the pressure within the adhesion chamber 2 is allowed to rise to and beyond atmospheric pressure, only nitrogen is introduced through the ejection lines 14a and 14b and into the adhesion chamber 2. Accordingly, the moisture in the air entering the adhesion chamber 2 is eliminated or minimized.

Finally, after the door of the adhesion chamber 2 is opened, the substrate 1 is taken out.

As described above, according to the present invention, nitrogen gas is injected into the chamber when the pressure within the adhesion chamber 2 is allowed rise to or rise above atmospheric pressure to prevent moisture from entering the chamber. Accordingly, the generation of contamination particles is minimized. Thus, electrical shorts and stains in the display of images are prevented.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of preventing generation of particles in a chamber, the method comprising:

mounting a substrate within a chamber of a gas-exposure equipment;

decreasing a pressure within the chamber;

injecting a surface treatment gas into the chamber, the surface treatment gas converting a surface of the substrate into an organic material;

increasing the pressure within the chamber to greater than or equal to atmospheric pressure by injecting a nitrogen gas into the chamber; and drawing out the surface treatment gas from the chamber while injecting the nitrogen gas into the chamber and preventing atmospheric air and moisture from penetrating the chamber.

2. The method as claimed in claim 1, wherein the surface treatment gas includes HMDS gas.

3. The method as claimed in claim 1, wherein the chamber includes evacuation lines and ejection lines.

4. The method as claimed in claim 3, wherein the injecting nitrogen gas into the chamber includes injecting the nitrogen gas through the ejection lines.

5. The method as claimed in claim 3, wherein the step of evacuating includes evacuating the surface treatment gas through the evacuation lines.

6. The method as claimed in claim 1, wherein the substrate is a thin film transistor substrate.

7. The method as claimed in claim 6, wherein the thin film transistor substrate includes at least one of a gate electrode, a source electrode, a drain electrode, and a pixel electrode.

8. The method as claimed in claim 1, wherein the substrate includes a color filter substrate.

9. The method as claimed in claim 8, wherein the color filter substrate includes at least one of a color filter and a black matrix.

10. A method to prevent generation of contaminating particles in a chamber, the method comprising:

evacuating an ordinary gas within said chamber;

injecting a treatment gas into said chamber to convert a surface of a substrate into an organic material;

increasing a pressure in said chamber to greater than or equal to atmospheric pressure by injecting a moisture displacing gas into the chamber; and withdrawing said treatment gas from said chamber while injecting the moisture displacing gas into said chamber and preventing atmospheric air from entering the chamber.

11. The method of claim 10, wherein said moisture displacing gas is nitrogen.

12. A method to prevent generation of contaminating particles in a chamber, the method comprising:

evacuating an ordinary gas within said chamber;

injecting a treatment gas into said chamber to treat a surface of a substrate;

increasing a pressure in said chamber to greater than or equal to atmospheric pressure by injecting a moisture displacing gas into the chamber; and withdrawing said treatment gas from said chamber while injecting the moisture displacing gas into said chamber and preventing atmospheric air from entering the chamber, wherein said treatment gas is HMDS.

* * * * *